US008236580B2

(12) United States Patent
Burnham et al.

(10) Patent No.: US 8,236,580 B2
(45) Date of Patent: Aug. 7, 2012

(54) COPPER CONTAMINATION DETECTION METHOD AND SYSTEM FOR MONITORING COPPER CONTAMINATION (75) Inventors: Jay Sanford Burnham, Fletcher, VT (US); Joseph Kerry Vaughn Comeau, Essex Junction, VT (US); Leslie Peter Crane, Williston, VT (US); James Randall Elliott, Richmond, VT (US); Scott Alan Estes, Essex Junction, VT (US); James Spiros Nakos, Essex Junction, VT (US); Eric Jeffrey White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/973,062

(22) Filed: Dec. 20, 2010

(65) Prior Publication Data

US 2011/0086442 A1 Apr. 14, 2011

Related U.S. Application Data (62) Division of application No. 11/863,502, filed on Sep. 28, 2007, now Pat. No. 7,888,142.

(51) Int. Cl.
*H01L 21/00* (2006.01)

(52) U.S. Cl. ............ 438/14; 438/7; 438/13; 257/E21.53

(58) Field of Classification Search .................. 438/4, 7, 438/8, 13, 14, 15
See application file for complete search history.

(56) References Cited

U.S. PATENT DOCUMENTS

| | | | |
|---|---|---|---|
| 6,607,927 B2 | 8/2003 | Ramappa et al. |
| 6,737,221 B2 | 5/2004 | Futase et al. |
| 7,141,992 B2 | 11/2006 | Ohno et al. |
| 2002/0180986 A1 | 12/2002 | Nikoonahad et al. |
| 2002/0182760 A1 | 12/2002 | Wack et al. |
| 2003/0064533 A1 | 4/2003 | Ramappa et al. |
| 2003/0104680 A1 | 6/2003 | Stefanescu et al. |
| 2005/0250297 A1 | 11/2005 | Shive et al. |
| 2009/0087928 A1 | 4/2009 | Burnham et al. |
| 2009/0088984 A1 | 4/2009 | Burnham et al. |

OTHER PUBLICATIONS

Notice of Allowance (Mail Date Feb. 2, 2011) for U.S. Appl. No. 11/863,623, Filing Date Sep. 28, 2007; Confirmation No. 2020.
312 Amendment E-filed Feb. 8, 2011 for U.S. Appl. No. 11/863,623, Filing Date Sep. 28, 2007; Confirmation No. 2020.
Boehringer et al.; Improved copper detection in hydrofluoric acid by recombination lifetime measurements on dedicated silicon substrates; 2002 American Institute of Physics; Applied Physics Letters, vol. 80, No. 3; Jan. 21, 2002; pp. 527-529.
Notice of Allowance (Mail Date Oct. 4, 2010) for U.S. Appl. No. 11/863,502, Filing Date Sep. 28, 2007; Confirmation No. 1809.
Office Action (Mail Date Aug. 26, 2010) for U.S. Appl. No. 11/863,623, Filing Date Sep. 28, 2007; Confirmation No. 2020.

*Primary Examiner* — Alexander Ghyka
(74) *Attorney, Agent, or Firm* — Schmeiser, Olsen & Watts; David A. Cain (57) ABSTRACT

A method of monitoring copper contamination. The method includes method, comprising: (a) ion-implanting an N-type dopant into a region of single-crystal silicon substrate, the region abutting a top surface of the substrate; (c) activating the N-type dopant by annealing the substrate at a temperature of 500° C. or higher in an inert atmosphere; (c) submerging, for a present duration of time, the substrate into an aqueous solution, the aqueous solution to be monitored for copper contamination; and (d) determining an amount of copper adsorbed from the aqueous solution by the region of the substrate.

16 Claims, 6 Drawing Sheets

COPPER CONTAMINATION DETECTION METHOD AND SYSTEM FOR MONITORING COPPER CONTAMINATION

RELATED APPLICATIONS

This application is a division of application Ser. No. 11/863,502 filed on Sep. 28, 2007. This application is related to application Ser. No. 11/863,623 filed on Sep. 28, 2007 entitled "COPPER CONTAMINATION DETECTION METHOD AND SYSTEM FOR MONITORING COPPER CONTAMINATION".

FIELD OF THE INVENTION

The present invention relates to the field of integrated circuit fabrication; more specifically, it relates to a method for monitoring copper contamination in an integrated circuit fabrication facility and a system for monitoring copper contamination in an integrated circuit fabrication facility.

BACKGROUND OF THE INVENTION

Modern integrated circuits are fabricated with copper interconnection wiring. Wet processing tanks in the integrated circuit fabrication can be contaminated with copper, causing yield loss and reliability concerns. Accordingly, there exists a need in the art for methods and systems for monitoring copper contamination of solution in wet processing tanks in integrated circuit manufacturing facilities.

SUMMARY OF THE INVENTION

A first aspect of the present invention is a method, comprising: (a) ion-implanting an N-type dopant into a region of single-crystal silicon substrate, the region abutting a top surface of the substrate; (c) activating the N-type dopant by annealing the substrate at a temperature of 500° C. or higher in an inert atmosphere; (c) submerging, for a present duration of time, the substrate into an aqueous solution, the aqueous solution to be monitored for copper contamination; and (d) determining an amount of copper adsorbed from the aqueous solution by the region of the substrate.

A second aspect of the present invention is the first aspect, further including: before (a), forming a thermal oxide layer on the top surface of the substrate.

A third aspect of the present invention is the second aspect, further including: between (c) and (d), removing the thermal oxide layer.

A fourth aspect of the present invention is the first aspect, further including: before (a), cleaning the top surface of the substrate.

A fifth aspect of the present invention is the first aspect, further including: before (a), selecting an ion implantation N-type dopant dose and energy to repeatably provide a copper measuring sensitivity of the region of the substrate in the range of copper concentrations expected to be found in the solution.

A sixth aspect of the present invention is the first aspect, further including: (e) determining a copper concentration of the solution based on the amount of copper found in the region of the substrate.

A seventh aspect of the present invention is the sixth aspect, wherein (e) includes: determining the copper concentration of the solution based on an empirically derived curve, table or formula derived from measuring amounts of copper in monitor wafers submerged, for the present duration of time, in respective aqueous solutions having known and different copper concentrations.

An eighth aspect of the present invention is the first aspect, further including: using the solution in a fabrication process used to fabricate integrated circuits.

A ninth aspect of the present invention is the first aspect, further including: containing the solution in a processing tank of a wet processing tool used in the fabrication process used to fabricate integrated circuits.

A tenth aspect of the present invention is the first aspect, wherein the solution to be monitored in selected from the group consisting of aqueous wafer cleaning solutions, aqueous wafer etching solutions, aqueous photoresist developing solutions and aqueous photoresist removal solutions.

An eleventh aspect of the present invention is the first aspect, wherein the solution to be monitored contains fluorine ions.

A twelfth aspect of the present invention is the first aspect, wherein after (c), a concentration of the N-type dopant in the region is between about 5 E19 atm/cm$^3$ and about 1 E22 atm/cm$^3$.

A thirteenth aspect of the present invention is the first aspect, wherein the determining the amount of copper in the region of the substrate includes performing Total Internal Reflected X-Ray Fluorescence, Secondary Ion Mass Spectroscopy, Time of Flight SIMS, Energy Dispersive X-Ray Fluorescence, Auger Spectroscopy or X-Ray Photo-electron Spectroscopy.

A fourteenth aspect of the present invention is the first aspect, further including: based on the determining an amount of copper in the region of the substrate, (e) implementing a corrective action selected from the group consisting of shutting down a tank of a wet processing tool used in the fabrication of integrated circuits containing the solution, limiting types of product wafers allowed in the tank, restricting fabrication levels of product wafers allowed in the tank, limiting a number of product wafers that can be processed before shutting down the tank, and shutting down the tank, draining the solution from the tank, cleaning the tank, and refilling the tank with fresh solution.

A fifteenth aspect of the present invention is a method, comprising: (a) forming a multiplicity of contamination monitors, each contamination monitor comprising an N-type region in a single-crystal silicon substrate, the region abutting a top surface of the substrate; (b) selecting an unused contamination monitor of the multiplicity of contamination monitors and submerging, for a preset duration of time, the selected contamination monitor of the multiplicity of contamination monitors into an aqueous solution contained in a tank of a processing tool used to fabricate integrated circuits; after (b), (c) determining an amount of copper in the region of the substrate of the one contamination monitor; after (c), (d) if the amount of copper exceeds a preset limit, taking a corrective action to prevent copper contamination of the integrated circuits; and (e) repeating steps (b) through (d) periodically.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Integrated circuits are fabricated in silicon layers of disc shaped semiconductor substrates often referred to as wafers. These wafers can have diameters of, to give a few examples, of 125 mm, 200 mm and 300 mm. The fabrication of integrated circuits requires frequent dipping of wafers into tanks containing various neutral, acidic (e.g., hydrofluoric, nitric, sulfuric, phosphoric and acetic) and basic (potassium hydroxide, tetramethylammonium hydroxide, ammonium hydroxide) aqueous wafer cleaning solutions, aqueous wafer etching solutions, aqueous photoresist developing solutions and aqueous photoresist removal solutions. Copper dissolved in these solutions can be adsorbed on the surface of N-type silicon when the surface concentration of N-type dopant (e.g., arsenic, phosphorous) exceeds a threshold value (e.g., about 1 E13 atm/cm$^2$ or higher). The higher the N-type dopant surface concentration, the more copper will be adsorbed on the surface.

Figure 1A:
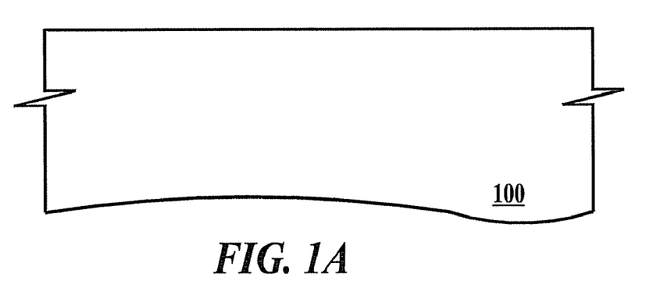
FIGS. 1A through 1D are cross-sectional drawings illustrating preparation of a monitor wafer according to embodiments of the present invention.

FIGS. 1A through 1D are cross-sectional drawings illustrating preparation of a monitor wafer according to embodiments of the present invention. In FIG. 1A a lightly (having a resistivity between about 10 ohm-cm and about 20 ohm-cm P-doped single-crystal silicon substrate 100 is provided. Substrate 100 may be cleaned, in one example, by immersion an aqueous solution of ammonia and hydrogen peroxide followed by immersion an aqueous solution of hydrogen chloride and hydrogen peroxide. Alternatively, substrate 100 may be lightly doped N-type (having a resistivity between about 50 ohm-cm and about 0.7 ohm-cm. Alternatively, substrate 100, may comprise upper and lower single-crystal silicon layers separated by a buried oxide (BOX) layer, commonly known as a silicon-on-insulator (SOI) substrate. Substrate 100 is advantageously a wafer having the same dimensions (diameter and thickness) of wafers on which integrated circuits processed through the tanks to be monitored. This allows normal wafer handling mechanisms and wafer routing procedures to be used.

Figure 1B:
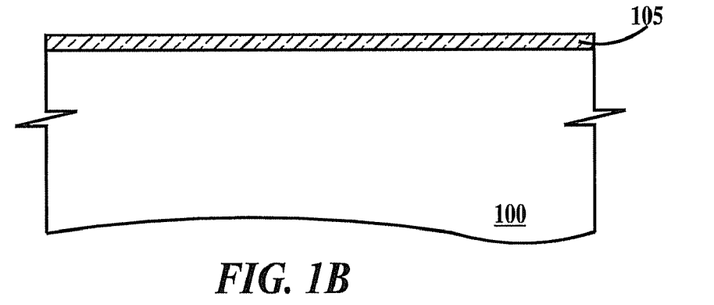

In FIG. 1B, an optional thermal silicon dioxide layer 105 is grown on by thermal oxidation (e.g., by oxidation at a temperature of about 500° C. or higher in oxygen in a furnace for about 30 minutes or by oxidation at a temperature of about 900° C. in oxygen for 5 seconds in a rapid-thermal-anneal (RTA) tool) of the surfaces of substrate 100. In one example, silicon dioxide layer is between about 0.4 nm and about 20 nm thick. Silicon dioxide layer 105 protects substrate 100 from contamination. Silicon dioxide layer 105 also helps to control the dopant profile generated by the steps described infra in relation to FIG. 1C.

Figure 1C:
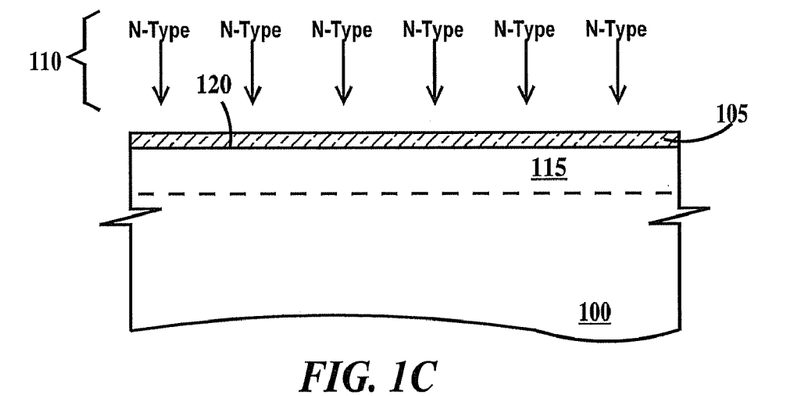

In FIG. 1C, an N-type ion implantation 110 is performed followed by an annealing step (e.g., at a temperature of about 500° C. or higher in an inert atmosphere in a furnace for about 30 minutes or at a temperature of about 900° C. in an inert atmosphere for 5 seconds in a RTA tool) to form an N-doped silicon region 115 in substrate 110. N-type ion implantation 110 may implant a phosphorus species or an arsenic species or a combination of both and arsenic and phosphorus species. N-doped region 115 extends from top surface 120 of substrate 100 a depth into the substrate determined by the thickness of silicon dioxide layer 105, the ion implantation dose, the ion implantation accelerating voltage, the ion implantation species and the anneal time and temperature. In one example, the ion implantation accelerating voltage is between about 2 KeV and about 25 KeV. In one example, the ion implantation dose of N-dopant species is between about 4 E13 atm/cm$^2$ and about 1 E16 atm/cm$^2$. The higher the concentration, the higher the sensitivity of the monitor to copper, but above ion implantation does of about 1 E16 atm/cm$^2$ cost and time of the ion implantation may be a factor. The dopant ion implantation dose and energy should be selected to repeatably provide a copper measuring sensitivity in the range of copper concentrations expected to be found in the solutions to be monitored.

At this point fabrication of the monitor wafer may be terminated and the monitor wafer stored for future use. Alternatively, the process described infra in reference to FIG. 1D may be performed.

Figure 1D:
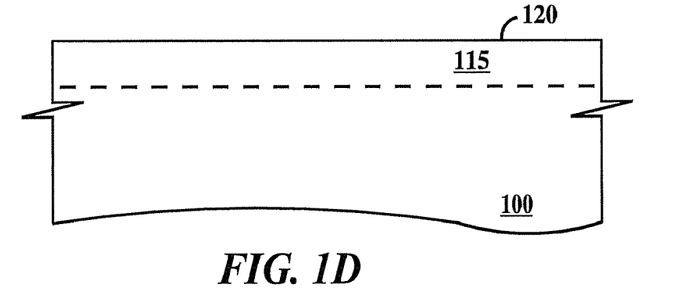

In FIG. 1D, thermal oxide layer 105 (see FIG. 1C) is removed. In one example, by etching in an aqueous hydrofluoric acid solution followed by a water rinse. The hydrofluoric acid solution may include ethylene glycol or ammonium fluoride. Other $SiO_2$ etchants may be used. A very thin native oxide layer (about 0.1 nm or less will form after rinsing). At this point the wafers may be stored. If no silicon oxide layer 105 was formed, then this step may be eliminated. A post anneal clean, similar to that described supra in reference to FIG. 1A may be performed.

Figure 2:
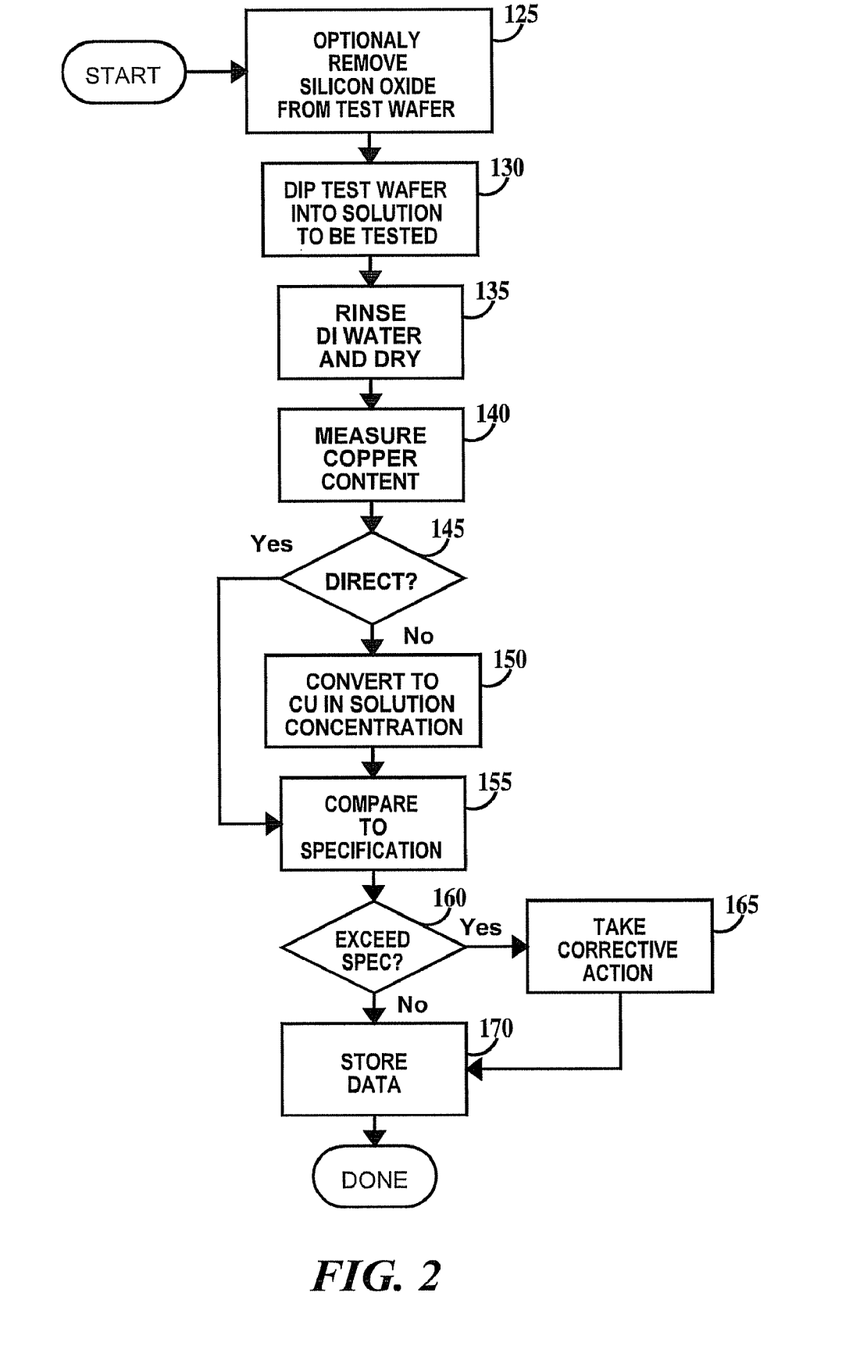
FIG. 2 is a flowchart for testing for copper contamination according to embodiments of the present invention.
Figure 3A:
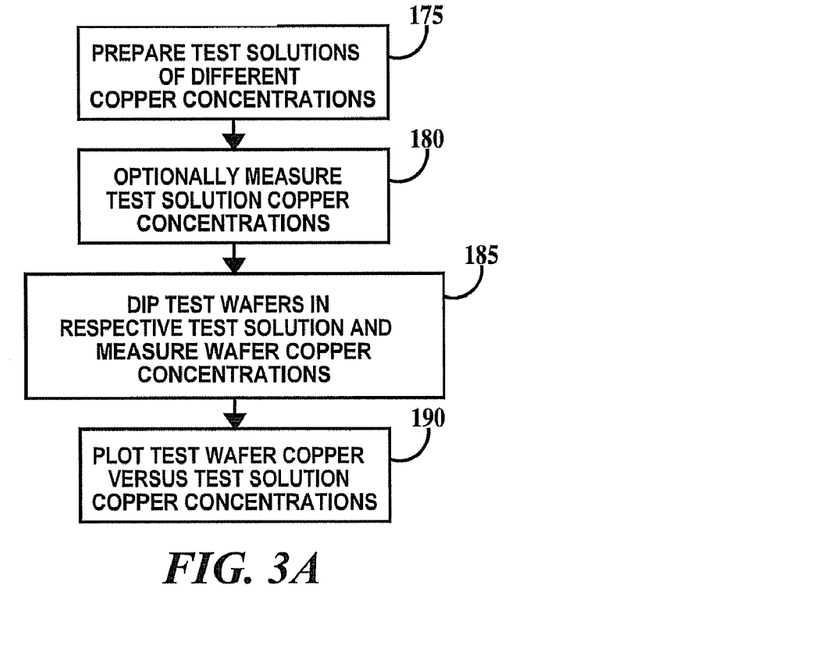
FIGS. 3A and 3B are flowcharts illustrating calibration of measurement procedures according to embodiments of the present invention.
Figure 3B:
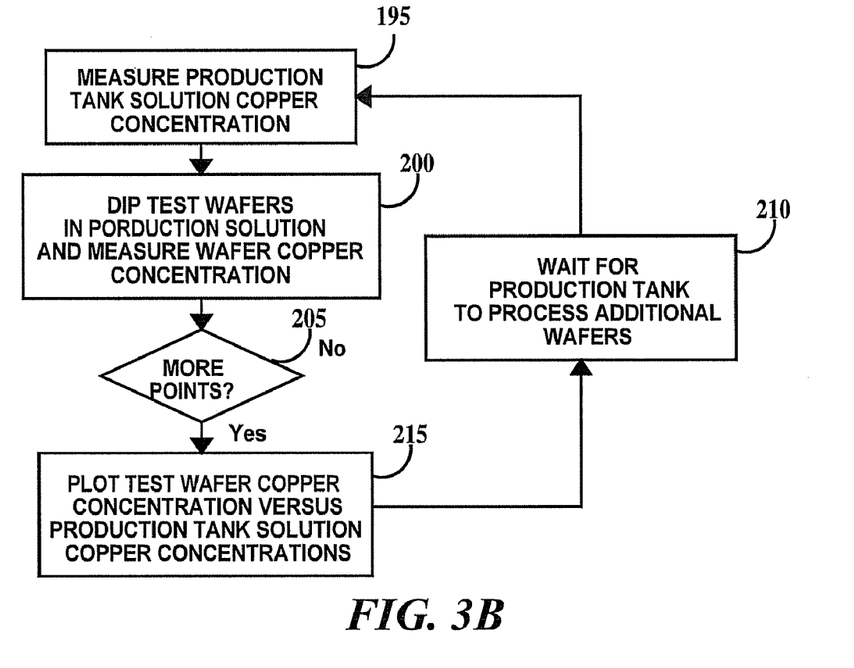

In the steps of FIGS. 2, 3A and 3B that follow, either a whole monitor wafer may be used or a portion of a monitor wafer. While the method will be described using whole wafers, it should be understood that whole wafers may be broken into multiple pieces and these pieces used instead of whole wafers. The use of whole wafers allows the use of the normal wafer handling equipment of automated processing tools. The use of pieces of monitor wafers reduces the cost preparing monitor wafers.

FIG. 2 is a flowchart for testing for copper contamination according to embodiments of the present invention. The method of monitoring for copper contamination starts by selecting a monitor wafer prepared as described supra. Step 125 is optional and is performed if the solution in the tank to be tested will not remove $SiO_2$ (e.g., does not contain fluorine ions) or will remove $SiO_2$ at such a slow rate as to effect the measurement or impact manufacturing schedules, then the monitor wafer is prepared by removing the $SiO_2$ layer (either thermal oxide layer 105 of FIG. 1C or the native oxide formed after removal of the thermal oxide layer as described supra). Removal of $SiO_2$ may be accomplished, for example, by etching in an aqueous hydrofluoric acid solution followed by a water rinse. The hydrofluoric acid solution may include ethylene glycol or ammonium fluoride. Other $SiO_2$ etchants may be used. If the solution of the tank to be tested will remove $SiO_2$, then step 125 may be skipped. The $SiO_2$ is removed because copper ions are not adsorbed on $SiO_2$ surfaces.

In step 130 the monitor wafer is dipped into the solution of the tank to be tested for a preset duration of time. After the preset time expires, in step 135, the monitor wafer is removed from the tank, rinsed in deionized water and dried. Then in step 140 the copper content of the monitor wafer is measured.

There are many methods and tools that may be used to measure the copper content of thin regions of the surface of the monitor wafer. Examples include, but are not limited to Total Internal Reflected X-Ray Fluorescence (TXFR), Secondary Ion Mass Spectroscopy (SIMS), Time of Flight SIMS (TOFSIMS), Energy Dispersive X-Ray Fluorescence (EDX), Auger Spectroscopy and X-Ray Photo-electron Spectroscopy (XPS).

In Step 145, a decision is made to compare the resultant copper measurement directly to an amount of copper allowed monitor wafer specification or convert the measurement to a copper concentration (e.g., parts per billion PPB) and compare to a copper concentration allowed in the solution specification. If conversion to solution concentration is required the method proceeds to step 150, otherwise the method proceeds to step 155.

If the comparison is to be based on a copper in solution concentration then in step 150 the measurement obtained in step 145 is converted, for example by use of a conversion graph (see FIG. 4), a conversion formula or a look-up table. In reality all three conversion methods are procedures applied to the same data. It should be understood that there are two types of copper in solution concentration conversions that can be performed and which are described infra in relation to FIGS. 3A, 3B and 4.

In step, 155, comparison to a specification indicating either a measured copper value or of a converted to copper in solution concentration value is performed. In one example the comparison is a simple look-up table procedure or a calculation based on a conversion formula. In one example, this is a control chart procedure, where results of values over time are charted, various statistical analysis are performed and control limits applied.

In step, 160, it is determined if the copper specification has been exceeded. If the copper specification has been exceeded, then the method proceeds to step 165, otherwise the method proceeds to step 170. In step 170, corrective action is taken. Corrective actions can include, for example, shutting down the tank and changing the solution, limiting the type of product wafers allowed in a particular tank (e.g., by part number), restricting the fabrication level of the product wafers allowed in the tank (e.g., to levels less sensitive or insensitive to copper contamination), limiting the number of product wafers that can be processed before shutting the tank down, and shutting the tank down, draining the contaminated solution, cleaning the tank, and refilling with fresh solution.

In step 170, the copper measurement and/or converted copper in solution value is labeled by date/time and tank ID and saved, and the method is complete.

FIGS. 3A and 3B are flowcharts illustrating calibration of measurement procedures according to embodiments of the present invention. Referring to FIG. 3A, in step 175 several solutions having known copper concentrations are prepared. These solutions may contain a fluorine based etchant. In step 180, the concentration of copper in the various test solutions is optionally verified by conventional quantitative copper analysis techniques. In step 185, monitor wafers are dipped into the different test solutions for a preset duration of time. The same preset duration of time is used for each solution. A different monitor wafer is dipped into each test solution. After rinsing and drying, the copper concentrations of the monitor wafers are measured using the analysis technique described in step 140 of FIG. 2 (e.g., TXFR, etc). In step 190, the copper concentrations measured in step 185 are plotted versus the copper concentrations from step 175 or 180 (see curve 225 of FIG. 4). The data points obtained may also be entered into a database and a conversion formula calculated from the data points.

Referring to FIG. 3B, step 195 the copper concentrations of a solution in a production tank is measured by conventional quantitative copper analysis techniques. In step 200, monitor wafers are dipped into the solution of the production tank for the same preset duration of time used in step 185 of FIG. 3A. After rinsing and drying, the copper concentrations of the monitor wafer is measured using the analysis technique used in step 185 of FIG. 3A (e.g., TXFR, etc). In step 205, it is determined if more data point are required. If more data points are required, then in step 210 enough time is allowed to pass to ensure a significant number (e.g., several hundred) production wafers have been processed though the solution of the production tank before proceeding to step 195. Otherwise the method proceeds to step 215. In step 215, the copper concentrations measured in step 200 are plotted versus the copper concentrations from step 195 (see curve 220 of FIG. 4). The data points obtained may also be entered into a database and a conversion formula calculated from the data points.

Figure 4:
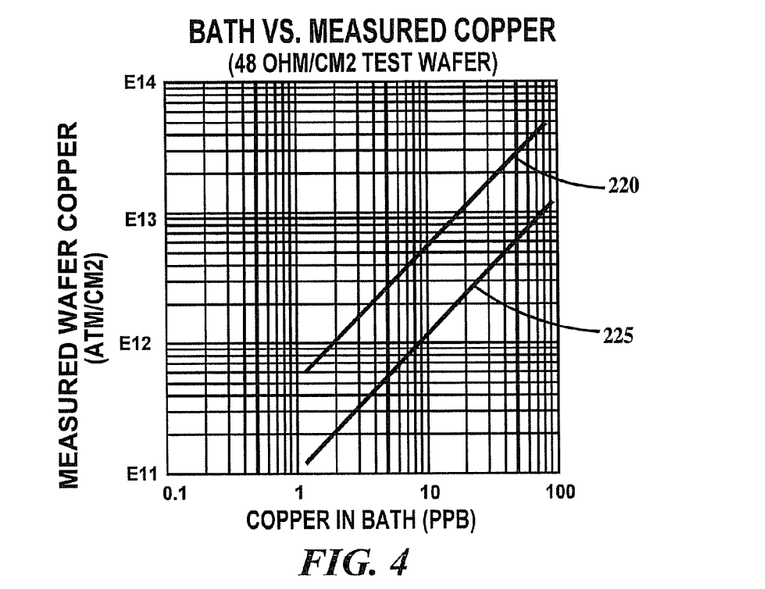
FIG. 4 is a log-log plot of known (or measured) copper concentration of a solution in a tank versus wafer surface copper concentration of wafers soaked in the solution of the tank.

FIG. 4 is a log-log plot of known (or measured) copper concentration of a solution in a tank versus wafer copper surface concentration of wafers soaked in the solution of the tank. The monitor wafers used to prepare curves 220 and 225 were processed by implanting a dose of 1 E16 $atm/cm^2$ arsenic at 2 KeV into a P type substrate and then RTA at 900° C. for 5 minutes. The sheet resistance was measured at 48 $ohm/cm^2$. In FIG. 4, curve 225 is based on test solutions prepared in control tanks and curve 225 is based on solutions in production tanks. The wafer concentrations were obtained using TXFR. From FIG. 4 it can be seen that both curves 220 and 225 are linear in a log-log scale. From FIG. 4 it can be seen that there is a constant offset between curve 220 and curve 225, with curve 220 (production tank solution) reporting more copper in solution than curve 225 (test tank solution) for the same TXRF value. This is thought to occur because of additional chemicals (e.g., dissolved Si) in the production tank enhancing monitor wafer copper adsorption or a difference in fluorine ion content between the production and test solutions. The TXFR measurement reports less copper in the production bath than is actually present. Therefore, step 150 of FIG. 2 can use either of curve 220 or 225 (or formulas or look-up tables based on the data points of curves 220 and 225) for conversion.

Figure 5:
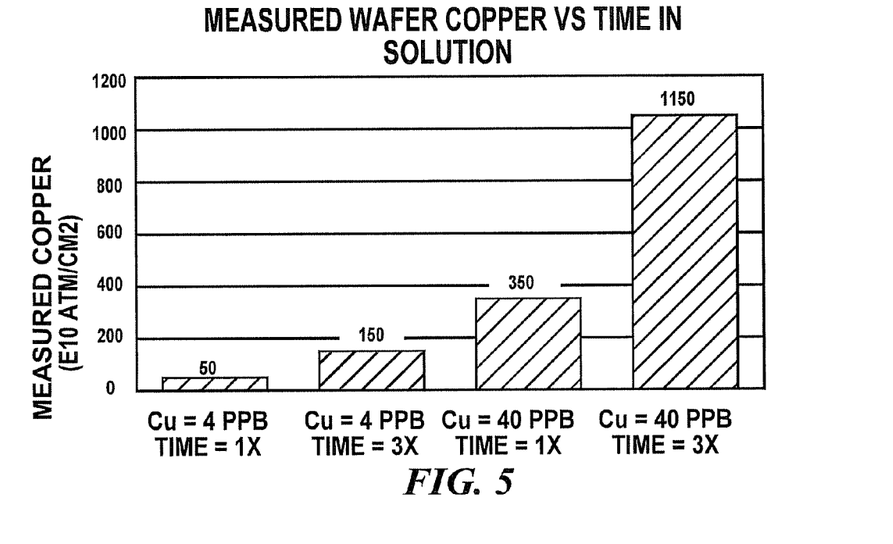
FIG. 5 is a plot of known copper concentrations of solutions in control tanks versus wafer copper surface concentration by time of soak.

FIG. 5 is a plot of known copper concentrations of solutions in control tanks versus wafer copper surface concentration by time of soak. The wafer concentrations were obtained using TXFR. FIG. 5 shows that copper adsorption by the monitor wafers is linear over time over a wide (e.g. 4 ppb to 40 ppb) range of copper in solution concentrations. The number above each histogram are approximate.

Figure 6:
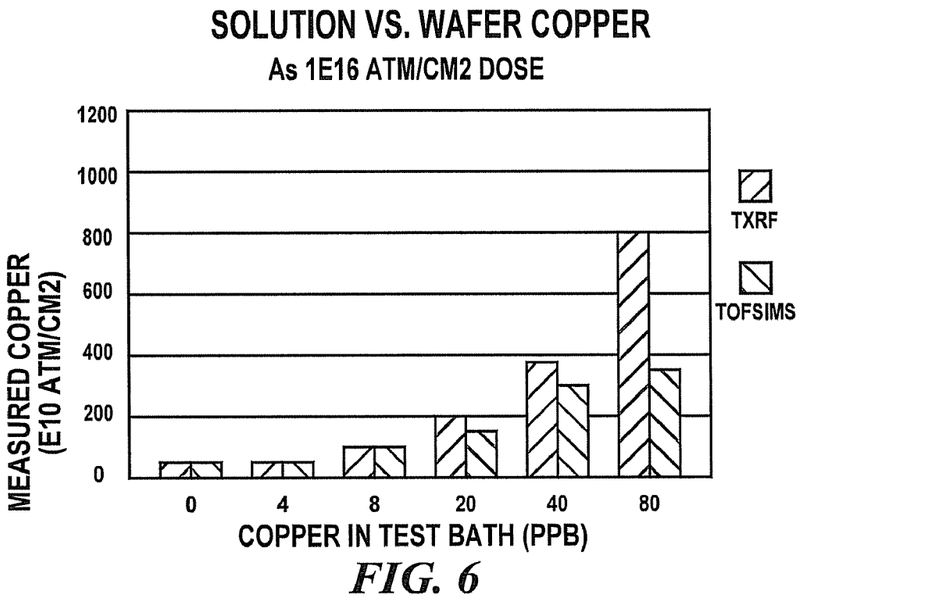
FIG. 6 is a plot of known copper concentration of a solution in a control tank versus wafer copper surface concentrations obtained by two wafer measurement techniques at a first dopant level.

FIG. 6 is a plot of known copper concentration of a solution in a control tank versus wafer copper surface concentrations obtained by two wafer measurement techniques at a first dopant level. In FIG. 6, measurements were made on similar monitor wafer using TXRF and TOFSIMS. The monitor wafers used to prepare FIG. 6 were processed by implanting a dose of 1 E16 atm/cm² arsenic at 2 KeV into a P type substrate and then RTA at 900° C. for 5 minutes.

Figure 7:
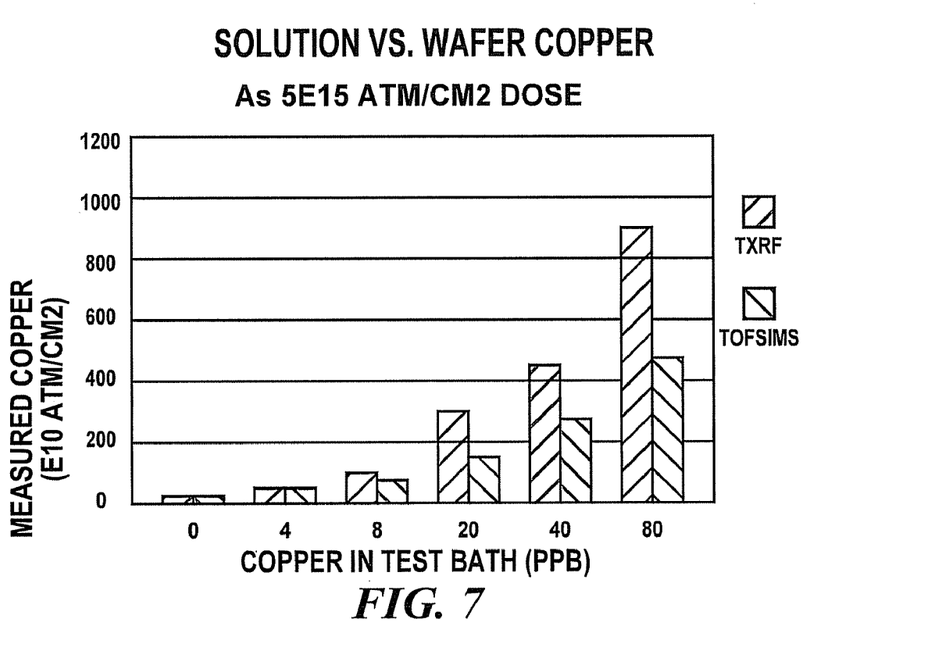
FIG. 7 is a plot of known copper concentration of a solution in a control tank versus wafer copper surface concentrations obtained by two wafer measurement techniques at a second dopant level.

FIG. 7 is a plot of known copper concentration of a solution in a control tank versus wafer copper surface concentrations obtained by two wafer measurement techniques at a second dopant level. In FIG. 6, measurements were made on similar monitor wafer using TXRF and TOFSIMS. The monitor wafers used to prepare FIG. 6 were processed by implanting a dose of 5 E15 atm/cm² arsenic at 2 KeV into a P type substrate and then RTA at 900° C. for 5 minutes.

Comparing FIGS. 6 and 7, the two methods (TXRF and TOFSIMS) generate different values, but track very well.

TXRF reports about the same copper solution concentrations for both dopant levels, while TOFSIMS reports about the same copper solution concentrations for both dopant levels except at 80 ppb and TXRF and TOFSIMS generally track, except for 80 ppb. To ensure the highest accuracy, calibration should be performed using the same dopant level monitor wafers and same wafer copper concentration measurement technique.

Figure 8:
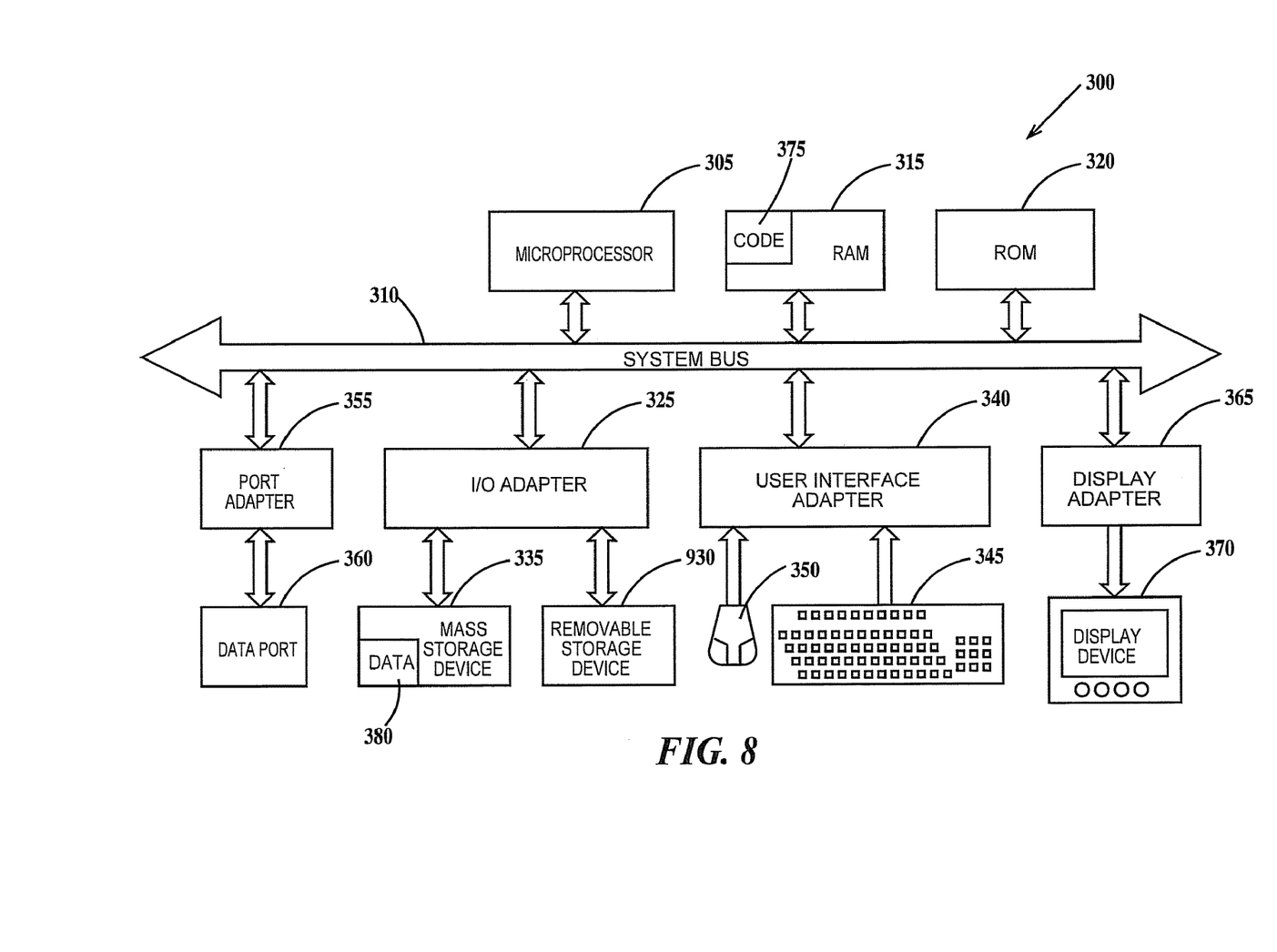
FIG. 8 is a schematic block diagram of a general-purpose computer for practicing the embodiments of the present invention.

FIG. 8 is a schematic block diagram of a general-purpose computer for practicing the embodiments of the present invention. In FIG. 8, computer system 300 has at least one microprocessor or central processing unit (CPU) 305. CPU 305 is interconnected via a system bus 310 to a dynamic random access memory (DRAM) device 315 and a read-only memory (ROM) device 320, an input/output (I/O) adapter 325 for a connecting a removable data and/or program storage device 330 and a mass data and/or program storage device 335, a user interface adapter 330 for connecting a keyboard 335 and a mouse 350, a port adapter 355 for connecting a data port 360 and a display adapter 365 for connecting a display device 370.

Either of devices 315 and 320 includes contains the basic operating system for computer system 300. Removable data and/or program storage device 330 may be a magnetic media such as a floppy drive, a tape drive or a removable hard disk drive or optical media such as CD ROM or a digital video disc (DVD) or solid state memory such as ROM or DRAM or flash memory. Mass data and/or program storage device 335 may be a hard disk drive or an optical drive. In addition to keyboard 335 and mouse 350, other user input devices such as trackballs, writing tablets, pressure pads, microphones, light pens and position-sensing screen displays may be connected to user interface 330. Examples of display devices include cathode-ray tubes (CRT) and liquid crystal displays (LCD).

One of devices 315, 320, 330 or 335 includes a computer code 375 (illustrated by way of example in device 315), which is a computer program that comprises computer-executable instructions. Computer code 375 includes an algorithm for generating calibration and conversion curves, tables or equation for copper in solution to copper adsorbed on a monitor wafer surfaces as well as for monitoring copper contamination in production wet processing tanks (e.g. the algorithm of FIGS. 2, 3A, 3B and curves of FIG. 4). CPU 305 executes computer code 375. Additional activities implemented on the computer system 300 include generating history or trend charts from periodic monitor measurements and performing statistical analysis on the periodic data. Any of devices 315, 320, 330 or 335 may include input data 380 (illustrated by way of example in device 335) required by computer code 375. Display device 370 displays output from computer code 375.

Any or all of devices 315, 320, 330 and 335 (or one or more additional memory devices not shown in FIG. 3) may be used as a computer usable medium (or a computer readable medium or a program storage device) having a computer readable program embodied therein and/or having other data stored therein, wherein the computer readable program comprises computer code 375. Generally, a computer program product (or, alternatively, an article of manufacture) of the computer system 300 may comprise the computer usable medium (or the program storage device).

Computer system 300 can indicate corrective actions to take by selecting an instruction from a list of instructions based on monitor wafer copper content measurements and displaying the instruction on, for example, display device 370. The instructions would correlate to the corrective actions listed supra and would be (for example) selected from the group consisting of (i) an instruction to shut down the tank of the processing tool containing the solution, (ii) an instruction to limit types of product wafers allowed in the tank, (iii) an instruction to restrict fabrication levels of product wafers allowed in the tank, (iv) an instruction to limit a number of product wafers that can be processed before shutting down the tank, and (v) an instruction to shut down the tank, drain the solution from the tank, clean the tank, and refill the tank with fresh solution.

Thus the present invention discloses a process for supporting computer infrastructure, integrating, hosting, maintaining, and deploying computer-readable code into the computer system 300, wherein the code in combination with the computer system 300 is capable of performing a method for monitoring copper contamination in wet processing tanks of integrated circuit fabrication facilities.

Thus, the embodiments of the present invention provide methods and systems for monitoring copper contamination of solutions in wet processing tanks in integrated circuit manufacturing facilities.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the present invention may be used to monitor spray processing tools where the solution is continuously collected and reused. Therefore, it is intended that the following claims cover all such modifications and changes as fall within the true spirit and scope of the invention.

What is claimed is:

1. A method, comprising:
(a) forming a multiplicity of contamination monitors, each contamination monitor comprising an ion-implanted N-type region in a single-crystal silicon substrate, said N-type region abutting a top surface of said substrate;
(b) selecting an unused contamination monitor of said multiplicity of contamination monitors and submerging, for a preset duration of time, said selected contamination monitor of said multiplicity of contamination monitors into an aqueous solution contained in a tank of a processing tool used to fabricate integrated circuits;
after (b), (c) determining an amount of copper adsorbed from said aqueous solution by said region of said substrate of said selected contamination monitor;
after (c), (d) if said amount of copper exceeds a preset limit, taking a corrective action to prevent copper contamination of said integrated circuits when processed in said tank before processing said integrated circuits through said tank and if said amount of copper does not exceed said preset limit then processing said integrated circuits through said tank; and (e) repeating steps (b) through (d) periodically.

2. The method of claim 1, further including:

between (d) and (e) determining a copper concentration of said solution based on said amount of copper found in said region of said substrate.

3. The method of claim 2, further including:

determining said copper concentration of said solution based on an empirically derived curve, table or formula derived from measuring amounts of copper in monitor wafers submerged, for said present duration of time, in respective aqueous solutions having known and different copper concentrations.

4. The method of claim 1, wherein said determining said amount of copper in said region of said substrate includes performing Total Internal Reflected X-Ray Fluorescence, Secondary Ion Mass Spectroscopy, Time of Flight SIMS, Energy Dispersive X-Ray Fluorescence, Auger Spectroscopy or X-Ray Photo-electron Spectroscopy.

5. The method of claim 1, further including:

between (d) and (e), based on said determining an amount of copper in said region of said substrate, implementing a corrective action selected from the group consisting of shutting down said tank of said processing tool containing said solution, limiting types of product wafers allowed in said tank, restricting fabrication levels of product wafers allowed in said tank, limiting a number of product wafers that can be processed before shutting down said tank, and shutting down said tank, draining said solution from said tank, cleaning said tank, and refilling said tank with fresh solution.

6. The method of claim 1, wherein concentrations of N-type dopant in said regions of said multiplicity of contamination monitors is between about 5 E19 atm/cm$^3$ to about 1 E22 atm/cm$^3$.

7. The method of claim 6, wherein said N-type dopant is arsenic.

8. The method of claim 6, wherein said N-type dopant is phosphorus.

9. The method of claim 1, wherein said ion implanted N-type region is formed by ion implanting an N-type dopant; and activating said N-type dopant by annealing at a temperature of 500° C. or higher in an inert atmosphere in a furnace.

10. The method of claim 1, wherein said ion implanted N-type region is formed by ion implanting an N-type dopant and activating said N-type dopant by annealing at a temperature of 900° C. or higher in an inert atmosphere in a rapid-thermal-anneal tool.

11. The method of claim 1, wherein (b) includes;

breaking said selected contamination monitor into multiple pieces;

selecting a piece of said multiple pieces;

submerging said selected piece into said solution; and after submerging said elected piece, performing (c) and (d) on said selected piece.

12. The method of claim 1, wherein said aqueous solution contains fluorine ions.

13. The method of claim 1, wherein each substrate of each contamination monitor of said multiplicity of contamination monitors is doped P-type and has a resistivity of between about 10-ohm-cm and about 20 ohm-cm.

14. The method of claim 1, wherein each substrate of each contamination monitor of said multiplicity of contamination monitors is doped N-type and has a resistivity of between about 50-ohm-cm and about 0.7 ohm-cm.

15. The method of claim 1, wherein each contamination monitor of said multiplicity of contamination monitors has the same dimensions of diameter and thickness as wafers on which said integrated circuits are fabricated in said processing tool.

16. A method, comprising:

(a) forming a multiplicity of contamination monitors, each contamination monitor comprising an N-type region in a single-crystal silicon substrate, said N-type region abutting a top surface of said substrate;

(b) selecting an unused contamination monitor of said multiplicity of contamination monitors, breaking said selected contamination monitor into multiple pieces, selecting a piece of said multiple pieces, and submerging, for a preset duration of time, said selected piece into said solution into an aqueous solution contained in a tank of a processing tool used to fabricate integrated circuits;

after (b), (c) determining an amount of copper in said selected piece;

after (c), (d) if said amount of copper exceeds a preset limit, taking a corrective action to prevent copper contamination of said integrated circuits when processed in said tank; and (e) repeating steps (b) through (d) periodically.

* * * * *